US006903593B2

(12) United States Patent
Wang

(10) Patent No.: US 6,903,593 B2
(45) Date of Patent: Jun. 7, 2005

(54) GAIN AMPLIFIER WITH DC OFFSET CANCELLATION CIRCUIT

(75) Inventor: Chao-Shiun Wang, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/687,657

(22) Filed: Oct. 20, 2003

(65) Prior Publication Data

US 2004/0251947 A1 Dec. 16, 2004

(30) Foreign Application Priority Data

Jun. 13, 2003 (TW) ........................................ 92116063 A

(51) Int. Cl.[7] ................................................. H03L 5/00
(52) U.S. Cl. ........................ 327/307; 327/362; 327/558; 330/3
(58) Field of Search ................................ 327/307, 362, 327/560–563, 558; 330/9, 252

(56) References Cited

U.S. PATENT DOCUMENTS 5,798,664 A * 8/1998 Nagahori et al. ........... 327/307
5,838,197 A * 11/1998 Tsukuda ..................... 330/252
6,288,604 B1 * 9/2001 Shih et al. ..................... 330/9
6,690,225 B2 * 2/2004 Kondo et al. ............... 327/307

* cited by examiner

Primary Examiner—Long Nguyen
(74) Attorney, Agent, or Firm—Bacon & Thomas, PLLC

(57) ABSTRACT

A DC offset cancellation circuit employs multiple feedback factors for canceling DC offset by increasing convergence time. The DC offset cancellation circuit features an active low-pass analogue filter including a variable resistor, an amplifier, a capacitor pair and a comparator, the amplifier being coupled to an output of the variable resistor. Negative feedback is provided from the output of the variable resistor to the input signal source, the capacitor pair is coupled to the amplifier, one input of the comparator is coupled to an output of the amplifier, and a second input of the comparator is coupled to a reference voltage source such that a comparison signal is output by the comparator to the variable resistor after comparing the negative feedback signal with a reference voltage.

3 Claims, 6 Drawing Sheets

GAIN AMPLIFIER WITH DC OFFSET CANCELLATION CIRCUIT

FIELD OF THE INVENTION

The present invention relates generally to a gain amplifier with a DC offset cancellation circuit, and, more particularly, to a gain amplifier with DC offset cancellation circuit applied in digital communications systems.

BACKGROUND OF THE INVENTION

The programmable gain amplifier is an indispensable component in digital communications systems. A programmable gain amplifier is provided for boosting the gain of signals such that received input signals from radio frequency front-end circuits can be adjusted to a suitable level. Accordingly, by doing so, the demand for dynamic range of a base band analog-digital converter (ADC) is reduced. Moreover, if the input signal has a DC offset, a gain amplifier can be utilized for boosting the DC offset of the input current. After being processed by the gain amplifier, the resulting signals will saturate the following baseband ADC stage. As a result of coupling of the RF input to local oscillators, due to input of mixers in the applied architectures for low intermediate frequency (low IF) and zero intermediate frequency (zero IF), it is highly likely that interference resulting from signals being mixed will be introduced, resulting in unavoidable DC offset. Therefore, it is desired to incorporate a DC offset cancellation circuit in the design for resolving the aforementioned problem. Furthermore, due to mismatch of components or manufacturing process flaws, the DC offset can also be observed in integrated circuits used in gain amplifier circuits. The architecture proposed in the present invention offers a solution for resolving such DC offset problem and a method for allowing the system to rapidly converge to stable status.

SUMMARY OF THE INVENTION

The main objective of the present invention is to provide a gain amplifier with a DC offset cancellation circuit. By applying multiple sets of feedback factors for reducing convergence time, the DC offset of the signals can be cancelled.

The other objective of the present invention is to provide a gain amplifier with a fast DC offset cancellation circuit, wherein the gain amplifier with DC offset cancellation circuit comprises a gain amplifier having an input end coupled to an input signal source, a buffer having an input end coupled to the output end of the gain amplifier; and an active low-pass analogue filter coupled to the output end of the buffer, for filtering input analogue signals at high frequencies and feeding the filtered output signals to the input of gain amplifier to be deducted from the input signals, so as to cancel DC bias.

DETAILED DESCRIPTION OF THE INVENTION

Figure 1:
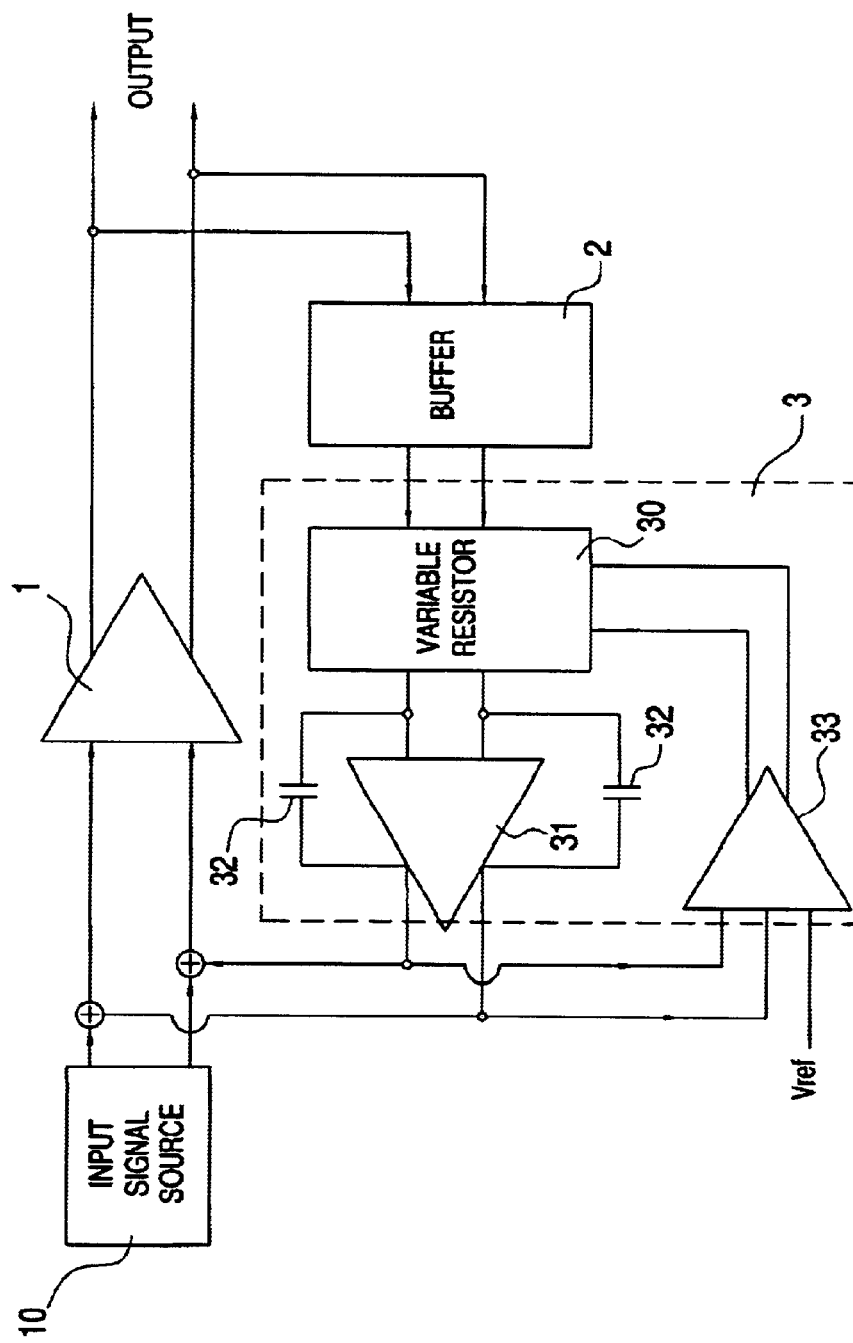
FIG. 1 is a schematic circuit diagram of a gain amplifier with DC offset cancellation circuit according to a preferred embodiment of the present invention.

Refer to FIG. 1, a schematic circuit diagram of a gain amplifier with DC offset cancellation circuit is illustrated according to a preferred embodiment of the present invention. The gain amplifier comprises a gain amplifier, a buffer 2 and an active low-pass analogue filter 3. The gain amplifier 1 has an input end coupled to an input signal source 10. The buffer 2 has an input end coupled to the output end of the gain amplifier 1. The active low-pass analogue filter 3 is coupled to the output end of the buffer 2 for filtering input analog signals at high frequencies and providing a negative feedback by outputting filtered input analog signals to the input end of input signal source 10 to be deducted from the input signals, so as to cancel DC bias.

The active low-pass analogue filter 3 implemented in the preferred embodiment according to the present invention comprises: a variable resistor 30, an amplifier 31, a capacitor pair 32 and a comparator 33. The amplifier 31 is coupled to the output end of the variable resistor 30. A negative feedback is provided from the output end of the variable resistor 30 to the input signal source 10. The capacitor pair is coupled to the amplifier 31. One input end of the comparator 33 is coupled to the output end of the amplifier 31. The other input end of the comparator 33 is coupled to a reference voltage source Vref. Comparison signals are output to the variable resistor 30 after comparing the negative feedback with the reference voltage Vref in the comparator 33.

The present invention operates with low capacitance value initially. Such a configuration converges system loops to a stable status. Then, operation is carried out with a higher capacitance value, so that DC bias drops to a low level. Such a sufficiently low DC bias does not interfere with bit-error-rate (BER) by over-filtering DC signals.

Figure 2:
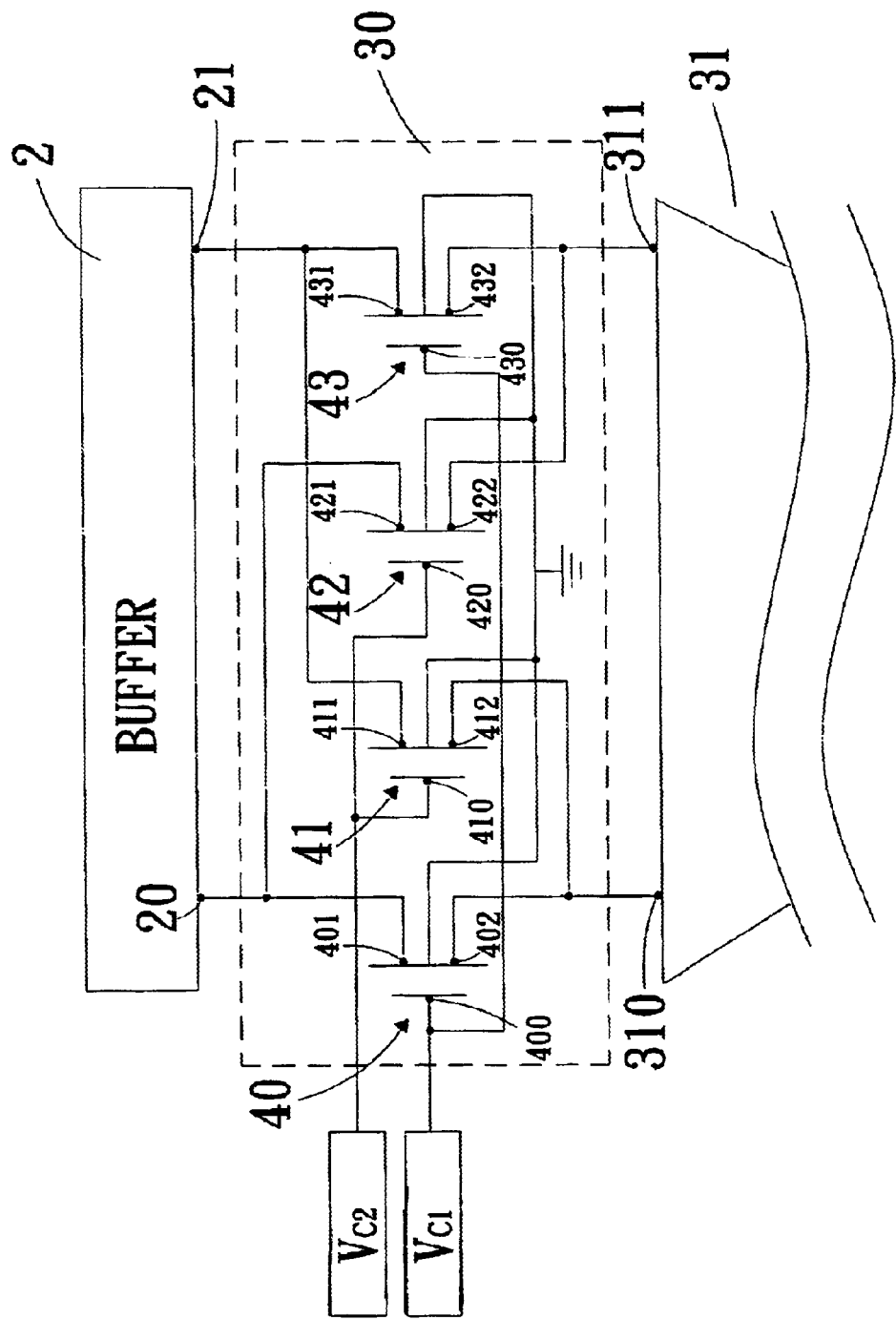
FIG. 2 is a circuit diagram of a variable resistor of the gain amplifier shown in the FIG. 1.

FIG. 2 is a circuit diagram of a variable resistor of the gain amplifier shown in the FIG. 1. The variable resistor 30 applied in the present embodiment comprises four metallic oxide semiconductor field effect transistors (MOSFETs) 40, 41, 42, and 43. The gates 400 and 430 of the MOSFETs 40 and 43 are coupled to a output end VC1 of the comparator 33 (not shown) for receiving a fixed reference voltage Vref. The gates 410 and 420 of the MOSFETs 41 and 42 are coupled to the other output end VC2 of the comparator 33 (not shown). The sources 401 and 421 of the MOSFETs 40 and 42 are coupled to a positive output end 20 of the buffer 2. The sources 411 and 431 of the MOSFETs 41 and 43 are coupled to a negative output end 21 of the buffer 2. The drains 402 and 412 of the MOSFETs 40 and 41 are coupled to a negative output end 310 of the amplifier 31. The drains 422 and 432 of the MOSFETs 42 and 43 are coupled to a positive output end 311 of the amplifier 31.

Figure 3:
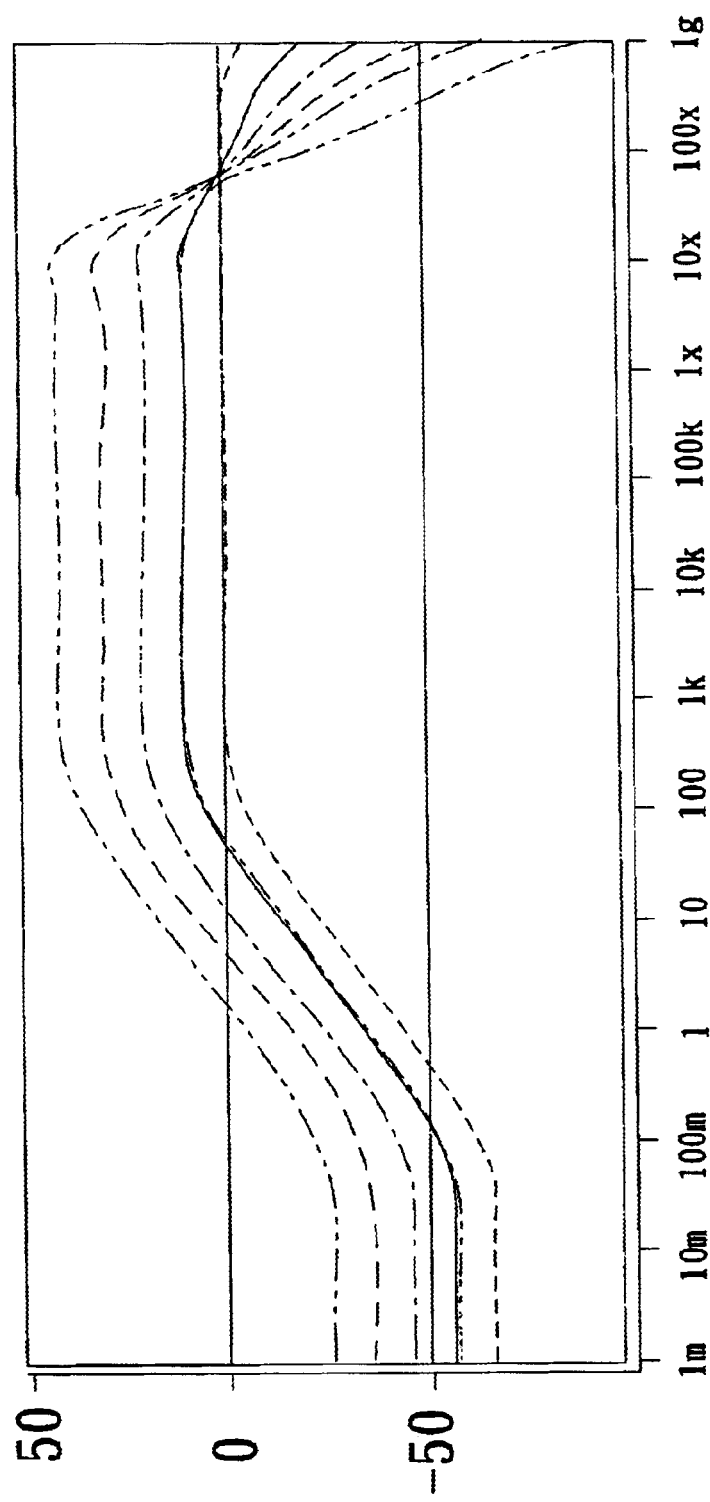
FIG. 3 is a schematic frequency response diagram according to the present invention.
Figure 4:
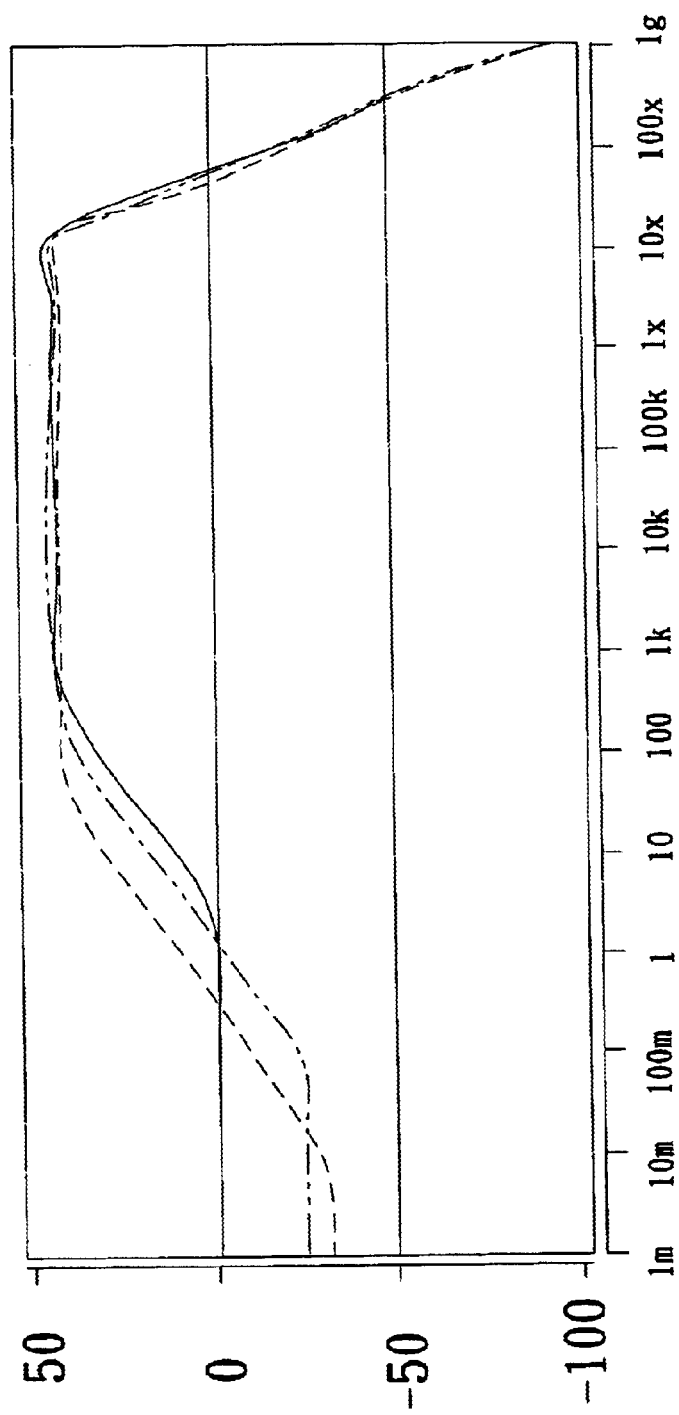
FIG. 4 is a schematic diagram illustrating simulation result under different temperatures when 48 dB gain is provided.
Figure 5:
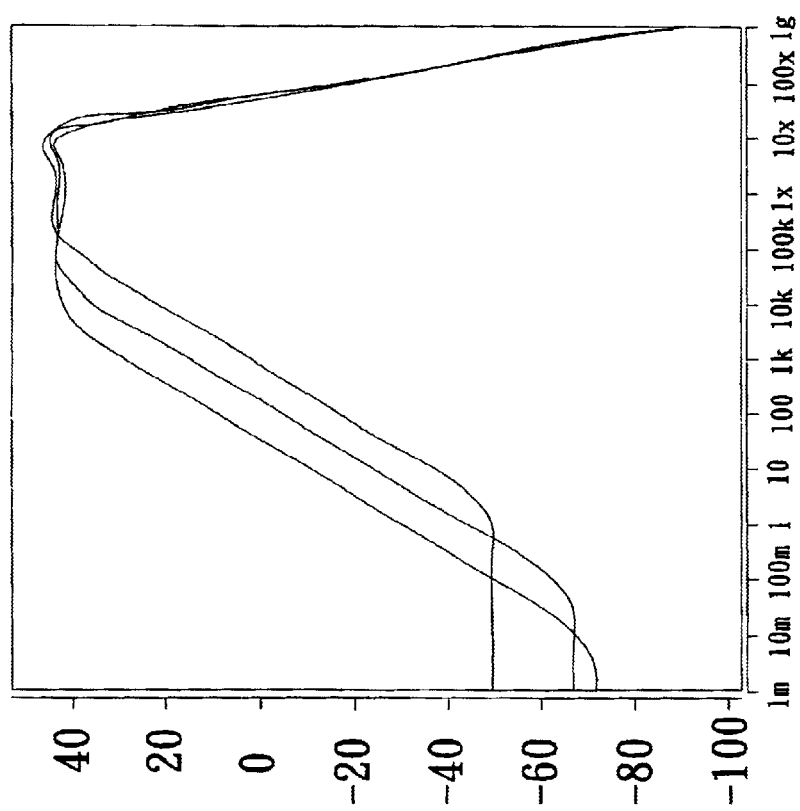
FIG. 5 is a schematic diagram illustrating simulation result under different temperatures when 48 dB gain is provided and a lower capacitance is feedback to a low-pass filter.
Figure 6:
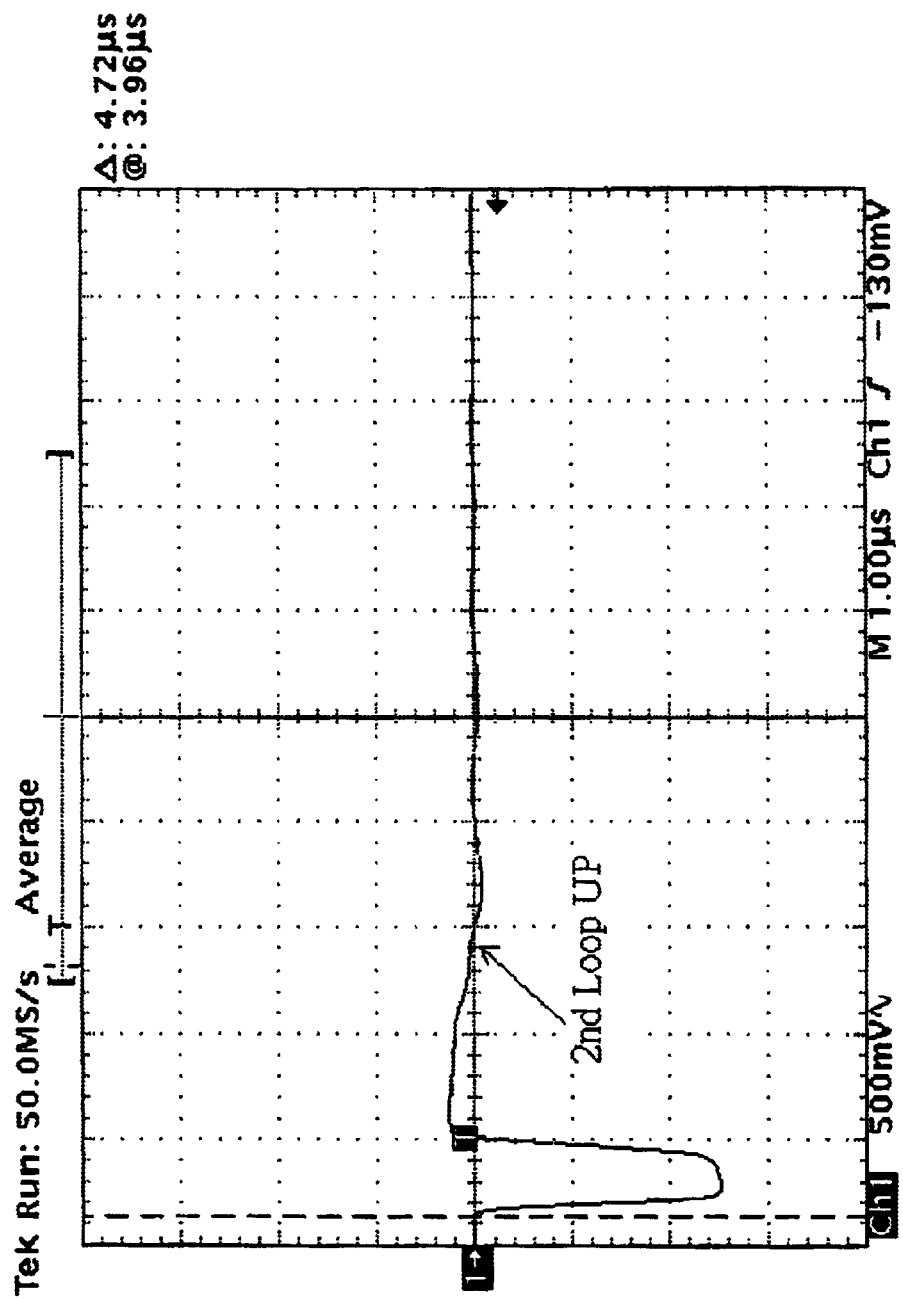
FIG. 6 is a schematic diagram illustrating test simulation result when a DC offset input is provided.

The simulation result is generated by a programmable gain amplfier of a communications system where low intermediate frequency architecture is adopted. The system is provided with a 48 dB gain by the programmable gain amplfier. FIG. 3 is a schematic frequency response diagram according to the present invention. The gain result shown in FIG. 3 is generated by a programmable gain amplfier where a higher capacitance value feedback is provided to a low pass filter. FIG. 4 is a schematic diagram illustrating simulation result under different temperatures when 48 dB gain is provided. FIG. 5 is a schematic diagram illustrating simulation result under different temperatures when 48 dB gain is provided and a lower capacitance is fed back to a low-pass filter. FIG. 6 is a schematic diagram illustrating test simulation results when a DC offset input is provided. When DC bias of ±400 mV input is provided, the system output is rapidly converged to ±50 mV and the system then switches to adopt a higher reactance value and assure the stability of the signals.

As shown in the preferred embodiment, the circuit volume of the integrated circuit of a gain amplifier is reduced by applying the aformentioned architecture according to the present invention. Multi bandwidth offered by multi loops is implemented by applying variable capacitors for controlling various feedback factors. Such configuration facilitates the convergence of all loops. Moreover, the configuration allows the system loop to be rapidly converged to a stable status.

Although the invention is illustrated and described herein with reference to particular embodiments, the invention is not intended to be limited to the details shown. Rather, various modifications may be made in the details within the scope and range of equivalents of the claims and without departing from the spirit of the invention.

What is claimed is:

1. A gain amplifier with DC offset cancellation circuit, the gain amplifier having an input end coupled to an input signal source, comprising:

a buffer, having an input end coupled to an output end of the gain amplifier, and an active low-pass analogue filter, coupled to the output end of the buffer, for filtering input analog signals at high frequencies, and feeding the filtered buffer output signals to the input end of the gain amplifier to be deducted from the input analog signals in order to obtain a negative feedback, so as to cancel DC bias, wherein the active low-pass analogue filter includes a variable resistor, an amplifier, a capacitor pair and a comparator, the amplifier being coupled to an output of the variable resistor, the negative feedback being provided from the output of the variable resistor to the input signal source, the capacitor pair being coupled to the amplifier, one input of the comparator being coupled to an output of the amplifier, and a second input of the comparator being coupled to a reference voltage source such that a comparison signal is output by the comparator to the variable resistor after comparing the negative feedback with a reference voltage.

2. The gain amplifier with DC offset cancellation circuit of claim 1, wherein the variable resistor comprises a plurality of metallic oxide semiconductor field effect transistors (MOSFETs).

3. The gain amplifier with DC offset cancellation circuit of claim 2, wherein the output end of the buffer includes at least two outputs, gates of said plurality of MOSFETs are coupled to the output of the comparator, sources of said plurality of MOSFETs are coupled to said outputs of the buffer, and drains of said plurality of MOSFETs are output to the amplifier for controlling an output voltage of the gain amplifier.

* * * * *